US006798368B2

(12) United States Patent
Jung et al.

(10) Patent No.: US 6,798,368 B2
(45) Date of Patent: Sep. 28, 2004

(54) APPARATUS FOR SUPPLYING GAMMA SIGNALS

(75) Inventors: Ji-Woon Jung, Gwangmyeong (KR); Yong-Weon Jeon, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/630,717

(22) Filed: Jul. 31, 2003

(65) Prior Publication Data

US 2004/0036705 A1 Feb. 26, 2004

(30) Foreign Application Priority Data

Aug. 21, 2002 (KR) ................................ 10-2002-0049552

(51) Int. Cl.[7] ................................................ H03M 1/66

(52) U.S. Cl. ....................... 341/144; 341/118; 348/674; 345/690

(58) Field of Search ................................ 341/118, 144; 348/674; 345/690

(56) References Cited

U.S. PATENT DOCUMENTS

2002/0145598 A1 * 10/2002 Shen et al. ................. 345/209
2003/0169248 A1 * 9/2003 Kim et al. .................. 345/204
2003/0218591 A1 * 11/2003 Shen et al. ................... 345/89
2004/0056868 A1 * 3/2004 Kato .......................... 345/600

* cited by examiner

*Primary Examiner*—Peguy JeanPierre
(74) *Attorney, Agent, or Firm*—Harness, Dickey & Pierce, P.L.C.

(57) ABSTRACT

A gamma signal supplying apparatus includes a timing controller for storing predetermined gamma values as digital values, and for transmitting one of the digital values serially. The gamma supplying apparatus may further include a gamma digital-to-analog controller (DAC) for receiving the serial digital gamma value, and for converting the serial digital gamma value into a first analog gamma value, and a plurality of column drive units, each of the plurality of column drive units for generating a second analog gamma value, for comparing the second analog gamma value to the first analog gamma value, and for outputting a gray level value based on the second analog gamma value if both values are substantially identical.

23 Claims, 6 Drawing Sheets

APPARATUS FOR SUPPLYING GAMMA SIGNALS

This application claims the priority of Korean Patent Application No. 2002-49552, filed on Aug. 21, 2002, in the Korean Intellectual Property Office, the disclosure of which is incorporated herein in its entirety by reference.

BACKGROUND OF THE INVENTION

1. Field of the Invention

The present invention generally relates to an apparatus for supplying gamma signals, and more particularly, to an apparatus for supplying gamma signals in a Thin-Film-Transistor-Liquid-Crystal-Display (TFT-LCD).

2. Description of the Related Art

Semiconductor integrated circuit products and various appliances often have high-functionality and high-density. Therefore, the assembly package technique normally also requires high functionality and high density. Accordingly, it may be desirable to generally improve surface mount techniques.

In a Thin-Film-Transistor (TFT) panel, a surface mount technique may need a conversion from a Tape Automated Bonding (TAB) scheme into a Chip On Glass (COG) scheme. If this is possible, cost saving during the manufacturing process may be achieved.

The TAB scheme normally involves connecting chips to external leads or Printed Circuit Board (PCB) circuits using tapes. Using tapes eliminates the need to wire use. The COG scheme normally requires attaching bare chips directly to a glass substrate.

When compared to an individual package, the COG scheme has the advantages of high-density, high-functionality, low cost, high-productivity, etc. Also, this method has improved capacitance and conductance. Another advantage when compared to a mold package is that signal transmission distances can be significantly shortened due to the substantial exclusion of lead frames.

However, the COG scheme has a disadvantage in that all signals required by a conventional LCD driver IC (LDI) chip may not be fully accommodated. In particular, due to spatial limitation of a substrate, all the needed signal lines may not be accommodated.

At least one signal used by an LDI chip may include a gamma correction signal. The gamma signal may define the brightness and contrast of a display. A correction of the gamma signal may be required to reduce the blooming or blurring of a display and thereby maintain constant brightness of substantially the whole display.

FIG. 1 is a view showing the structure of a conventional apparatus for supplying gamma signals in a TFT panel. As shown in FIG. 1, a conventional gamma signal supplying unit may include a gamma signal generator 10 and a gray level resistor array 11. The gamma signal generator 10 may output voltages, VR1 through VR8 for each resistor, in parallel. The gray level resistor array 11 subdivides the voltage values output in parallel, respectively, and outputs one level value among all 256 levels of brightness values.

However, when using a surface mount technique of the COG scheme, parallel transmission of voltages may be required an increase in the number of signal lines. But as discussed, the surface mount technique of the COG scheme has limited signal line availability. Accordingly, it may be necessary to reduce the number of signal lines for providing gamma signals.

SUMMARY OF THE INVENTION

An exemplary embodiment of the present invention may provide a gamma signal supplying apparatus capable of reducing the number of signals to be transmitted. This may be achieved by transmitting as a serial signal a gamma signal among the signals required by an LDC driver IC (LDI) chip.

According to one exemplary embodiment of the present invention, a gamma signal supplying apparatus may include a timing controller for storing predetermined gamma values as digital values, and for transmitting one of the digital values serially. The gamma supplying apparatus may further include a gamma digital-to-analog controller (DAC) for receiving the serial digital gamma value, and for converting the serial digital gamma value into a first analog gamma value, and a plurality of column drive units, each of the plurality of column drive units for generating a second analog gamma value, for comparing the second analog gamma value to the first analog gamma value, and for outputting a gray level value based on the second analog gamma value if both values are substantially identical.

According to one exemplary embodiment of the present invention, a gamma signal supplying apparatus may include a timing controller for storing a predetermined gamma values as digital values, for transmitting one of the digital gamma values serially, and for outputting a reference digital code, a gamma digital-to-analog converter (DAC) for receiving the serial digital gamma value, for converting the digital gamma value into a first analog gamma value, for comparing the first analog gamma value to a second analog gamma value input from a following unit, and for outputting the comparison result to the timing controller, and a plurality of column drive units, each the plurality of column drive units for receiving the reference digital code, for generating a second analog gamma value corresponding to the reference digital code to output the same to the gamma DAC, for receiving a predetermined indication signal from the timing controller, and for outputting a gray level value based on the second analog gamma value, wherein the timing controller receives the comparison result, and outputs the indication signal to the corresponding column drive unit if the first and second analog the gamma values are substantially identical.

According to yet another exemplary embodiment of the present invention, a gamma signal supplying apparatus may include a timing controller for storing predetermined gamma values as digital values, for transmitting one among the stored digital values serially, and for outputting a first reference digital code and a second reference digital code, a first column drive unit for generating a first analog gamma value corresponding to the first reference digital code, for outputting a gray level value based on the analog gamma value, the first column drive unit including a first comparator for comparing the first analog gamma value with a second analog gamma value input from a following unit, and for outputting the compared result to the timing controller, and a plurality of second column drive units, each of the second column drive units serially connected and positioned behind the first column drive unit, for generating a second analog gamma value corresponding to the second reference digital code to output the same to a previous column drive unit, for outputting a gray level value based on the second analog gamma value if a predetermined indication signal is received from the timing controller. The second column drive unit includes a second comparator for comparing the second analog gamma value with a third analog gamma value inputted from a following unit, and for outputting the compared result to the timing controller, wherein the timing controller outputs the indication signal to one of two column drive units and comparison targets if values compared by the first or second comparator are substantially identical.

Further scope of applicability of the present invention will become apparent from the detailed description given hereinafter. However, it should be understood that the detailed description and specific examples, while indicating exemplary embodiments of the present invention, are given by way of illustration only, since various changes and modifications within the spirit and scope of the invention will become apparent to those skilled in the art from this detailed description.

BRIEF DESCRIPTION OF THE DRAWINGS

Exemplary embodiment s of the present invention will become more fully understood from the detailed description given hereinbelow and the accompanying drawings which are given by way of illustration only, and thus are not limitative of the present invention, and wherein.

DETAILED DESCRIPTION OF EXEMPLARY EMBODIMENTS OF THE PRESENT INVENTION

Hereinafter, exemplary embodiments of the present invention will be described in detail with reference to the included drawings.

Figure 2A:
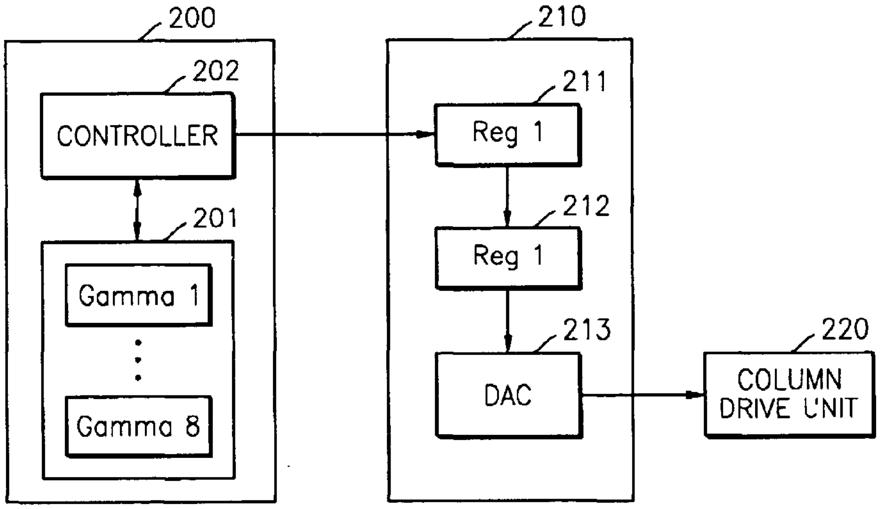
FIGS. 2*a* and 2*b* are block diagrams of an apparatus for supplying gamma signals, according to an exemplary embodiment of the present invention.
Figure 2B:
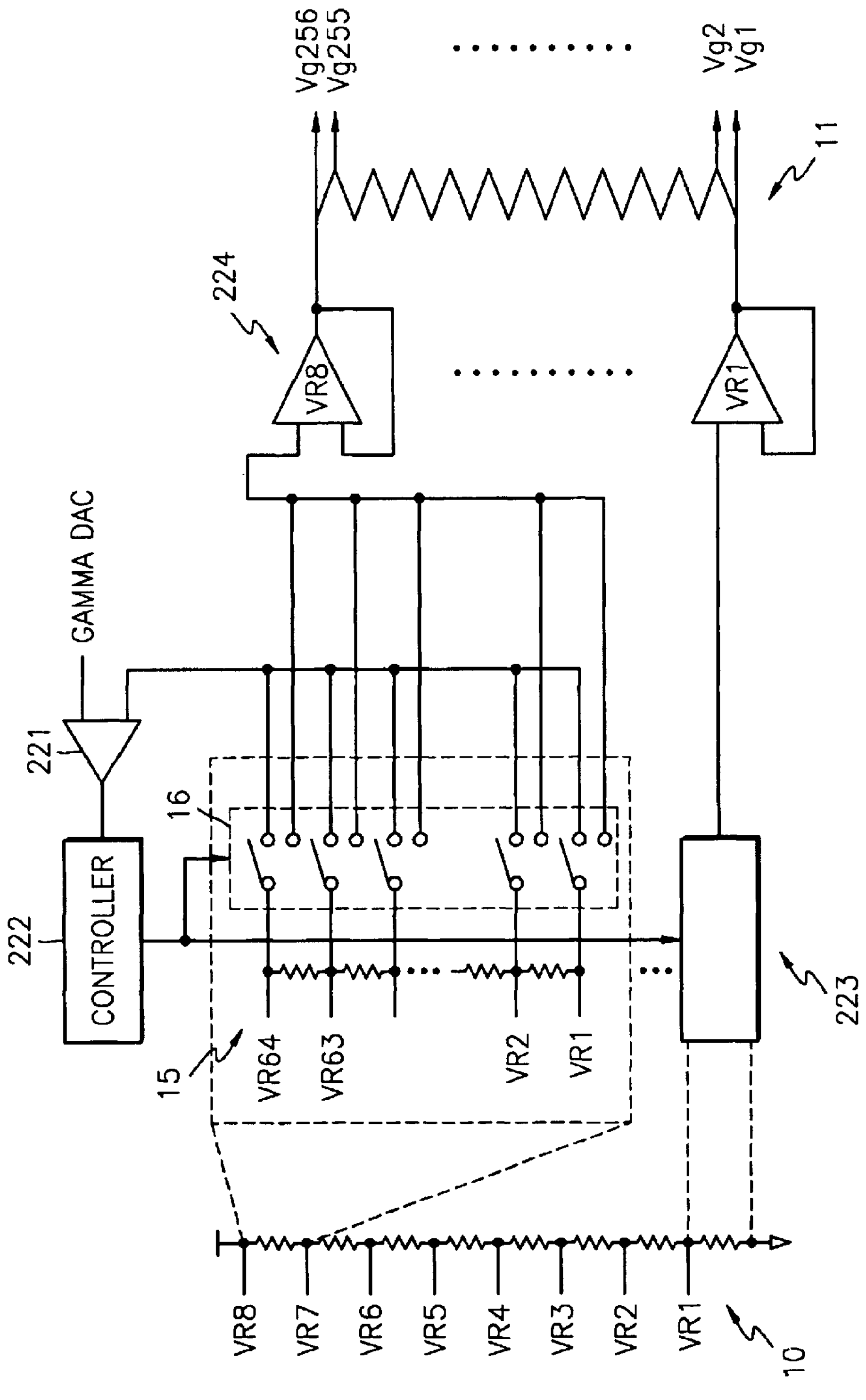

FIGS. 2*a* and 2*b* are block diagrams of an apparatus for supplying gamma signals, according to an exemplary embodiment of the present invention. The apparatus for supplying the gamma signals may include a timing controller (TCON) 200, a gamma DAC (Digital-to-Analog Converter) 210, and a column drive unit 220. Although, a plurality of column drive units 220 may provided, for ease of illustration, only one column drive unit 220 is illustrated. However, it should be understood that the exemplary embodiments of the present invention are not limited to only one column drive unit 220.

The TCON 200 may include a gamma value generator 201 and a controller 202. The gamma DAC 210 may include two registers 211 and 212, and a DAC 213. According to one exemplary embodiment of the present invention, the column drive unit 220 may have the structure shown in FIG. 2*b*.

Figure 1:
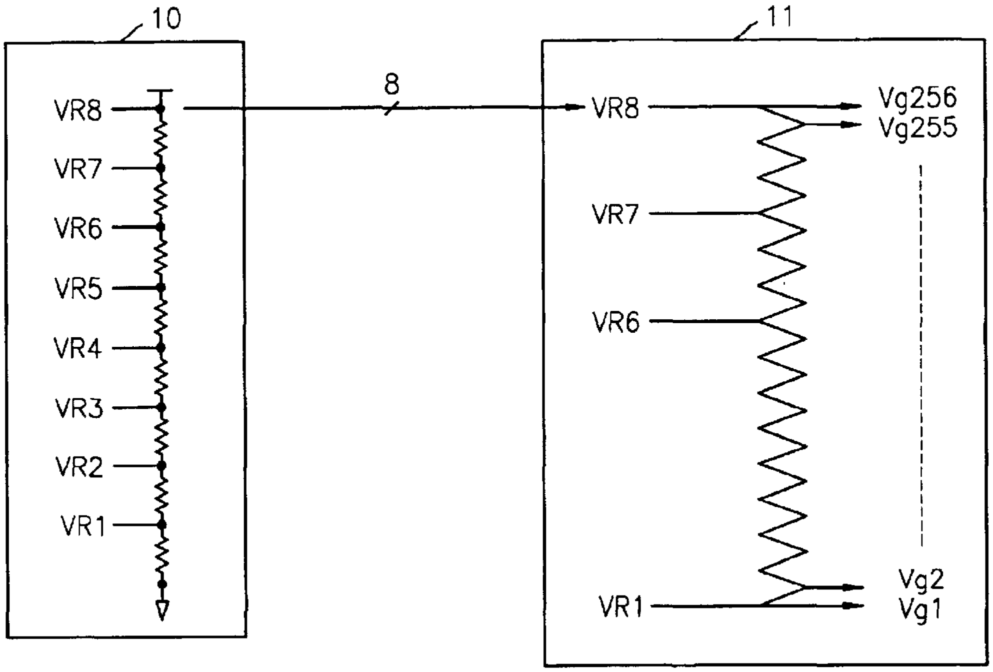
FIG. 1 is a view showing the structure of a conventional apparatus for supplying gamma signals in a TFT panel.

The gamma value generator 201 may store multiple voltage levels in respective registers, just as in the gamma signal generator 10 of FIG. 1. The gamma value generator 201 may output one of the stored values according to a control signal from the controller 202. The controller 202 is capable of serially transmitting the value generated from the gamma value generator 201. The first register 211, similar to a shift register, may sequentially store the serially inputted value and transmit the sequentially stored value to the second register 212 in parallel after the storing process of the first register 211 is completed. The DAC 213 is capable of converting the digital value input in parallel from the second register 212 to an analog value.

The column drive unit 220 may include a comparator 221, a controller 222, a gamma search unit 223, a buffer unit 224, and a gray level resistor array 11. The comparator 221 is capable of comparing a value received from the gamma DAC 210 with a value output from the gamma search unit 223. The gamma search unit 223 may include a resistor array 15 and a switch unit 16.

The resistor array 15 may have a plurality of resistors arranged in a manner which subdivides the gamma value generated from the gamma signal generator 10. The gamma value subdivision may be required for exact detection of the gamma value transferred from the gamma DAC 210. This is because resistance values in the respective chips may be different from each other, although the chips are manufactured using the same process, The controller 222 may include addresses for facilitating a gamma value search in the resistor array 15. That is, the controller 222 may read gamma values from the resistor array 15 sequentially via the switch unit 16 and output the read values to the comparator 221. If the value input from the gamma DAC 210 is substantially identical to the value read via the switch unit 16, the comparator 221 outputs the gamma value to the buffer unit 224 via the switching unit 16. If both values are not substantially identical, the comparator 221 reads the next gamma value via the switch unit 16.

The gray level resistor array 11 may output a gray level value based on the value stored in the buffer unit 224.

Figure 3A:
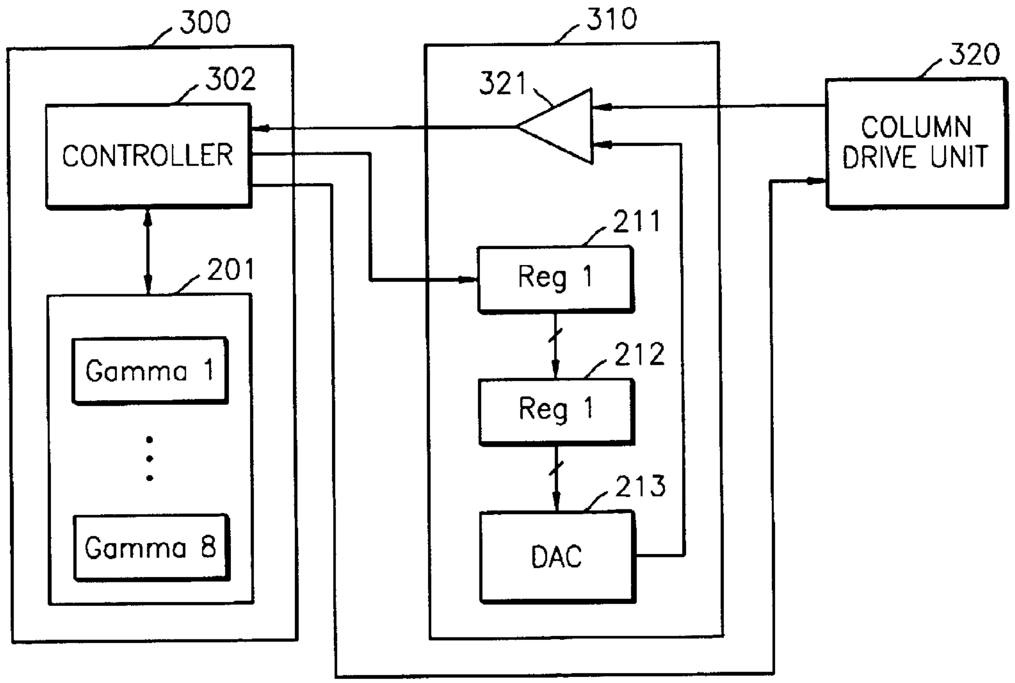
FIGS. 3*a* and 3*b* are block diagrams of an apparatus for supplying gamma signals, according to another exemplary embodiment of the present invention.
Figure 3B:
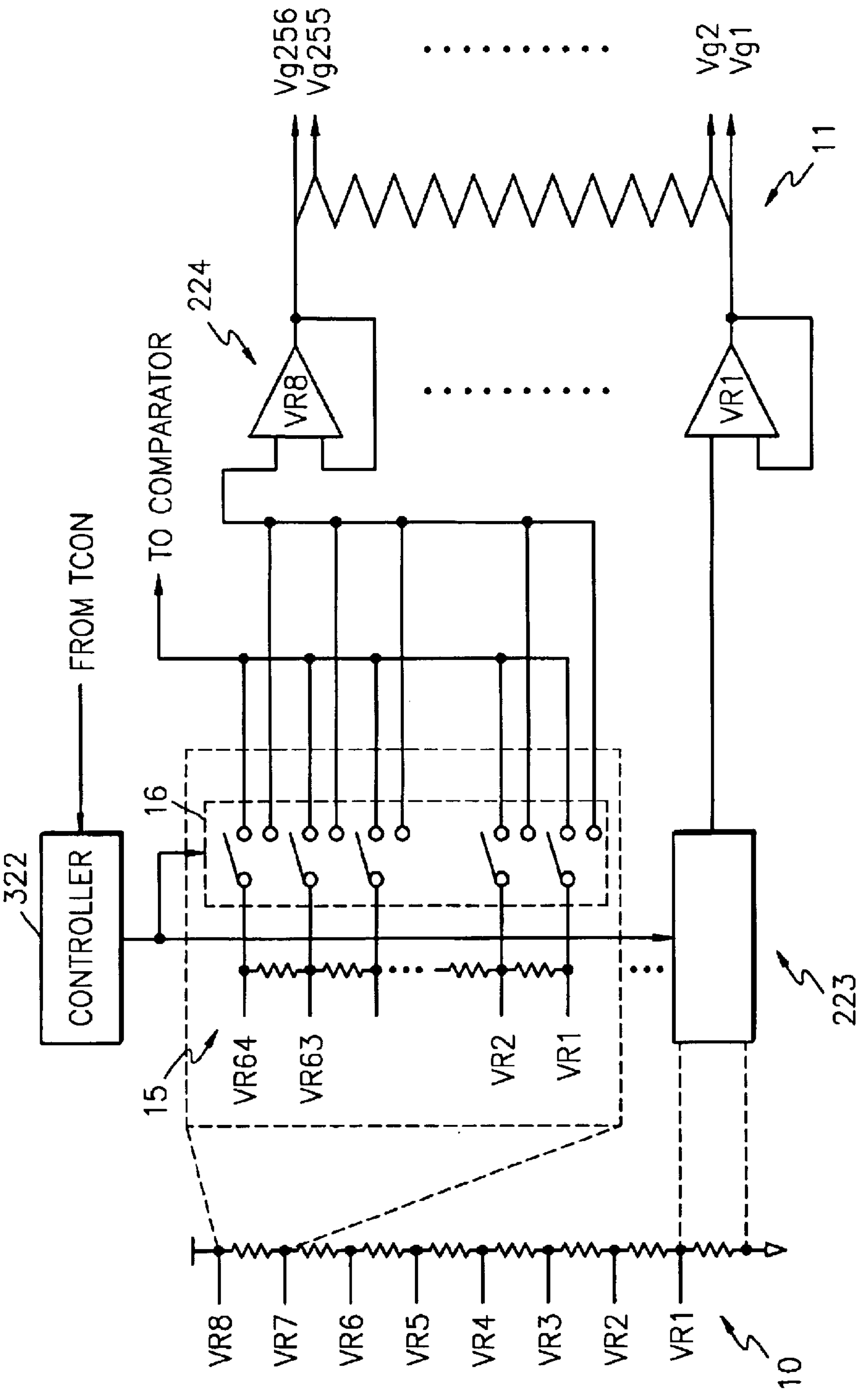

FIGS. 3*a* and 3*b* are block diagrams of an apparatus for supplying gamma signals, according to another exemplary embodiment of the present invention. The apparatus for supplying the gamma signals may include a TCON 300, a gamma DAC 310, and a column drive unit 320. Although, a plurality of column drive units 320 may provided, for ease of illustration, only one column drive unit 320 is illustrated. However, it should be understood that the exemplary embodiments of the present invention are not limited to only one column drive unit 320.

The TCON 300 may include a gamma value generator 201 and a controller 302. The gamma DAC 310 may include two registers 211 and 212, a DAC 213, and a comparator 321. The column drive unit 320 may have the structure as shown in FIG. 3*b*.

In FIGS. 3*a* and 3*b*, components having the same reference numbers as those of FIGS. 2*a* and 2*b* operate in the same manner as the respective components of FIGS. 2*a* and 2*b*.

The gamma value generator 201 may store multiple voltage levels in respective registers, just as in the gamma signal generator 10 of FIG. 1. The gamma value generator 201 outputs one of the stored values according to a control signal of the controller 302. The controller 302 may transmit the value generated from the gamma value generator 201 to the first register 211, and also output the value as a digital code value to the column drive unit 320. The first register 211 is capable of sequentially storing the serially inputted value, and may transmit the sequentially stored value to the second register 212 in parallel after the storing process into the first register 211 is completed. The DAC 213 may convert the digital value input in parallel from the second register 212 into an analog value, and is capable of transmitting the analog value to the comparator 321. The comparator 321 may compare the value output from the DAC 213 to a value transmitted from the column drive unit 320. If both values are substantially identical, the controller 302 may stop its search operation. If both values are not substantially identical, the controller 302 may output a control signal to the gamma value generator 201 in order to continue searching for another gamma value.

The column drive unit 320 may include a controller 322, a gamma search unit 223, a buffer unit 224, and a gray level resistor array 11. The gamma search unit 223 may include a resistor array 15 and a switch unit 16.

The controller 322 may drive the switch unit 16 to read a corresponding gamma value from the resistor array 15, according to a reference digital code transmitted from the controller 302 of the TCON 300, and then may output the read gamma value to the comparator 321 of the gamma DAC 310. If the value output from the DAC 213 is decided to be substantially identical to the value output from the column drive unit 320, the controller 322 may output the read gamma value to the buffer unit 224 via the switch unit 16. If both values are not substantially identical, the controller 302 of the TCON 300 may output another reference digital code to the column drive unit 320. The controller 322 again may drive the switch unit 16 to read another gamma value from the resistor array 15 according to the reference digital code and may output the read gamma value to the comparator 321.

The gray level resistor array 11 may output a gray level value based on the value stored in the buffer unit 224.

In an exemplary embodiment of the present invention, a plurality of column drive units 320 may share a line in order to output an analog signal to the comparator 321 of the gamma DAC 310. Therefore, appropriate control for line sharing may be required.

Figure 4A:
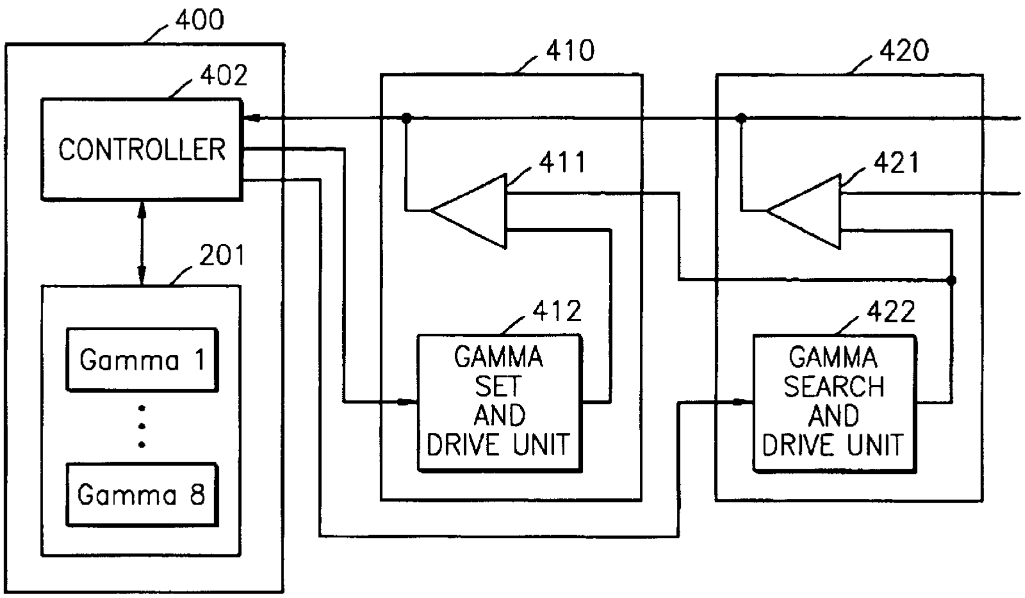
FIGS. 4*a* and 4*b* are block diagrams of an apparatus for supplying gamma signals, according to a still another exemplary embodiment of the present invention.
Figure 4B:
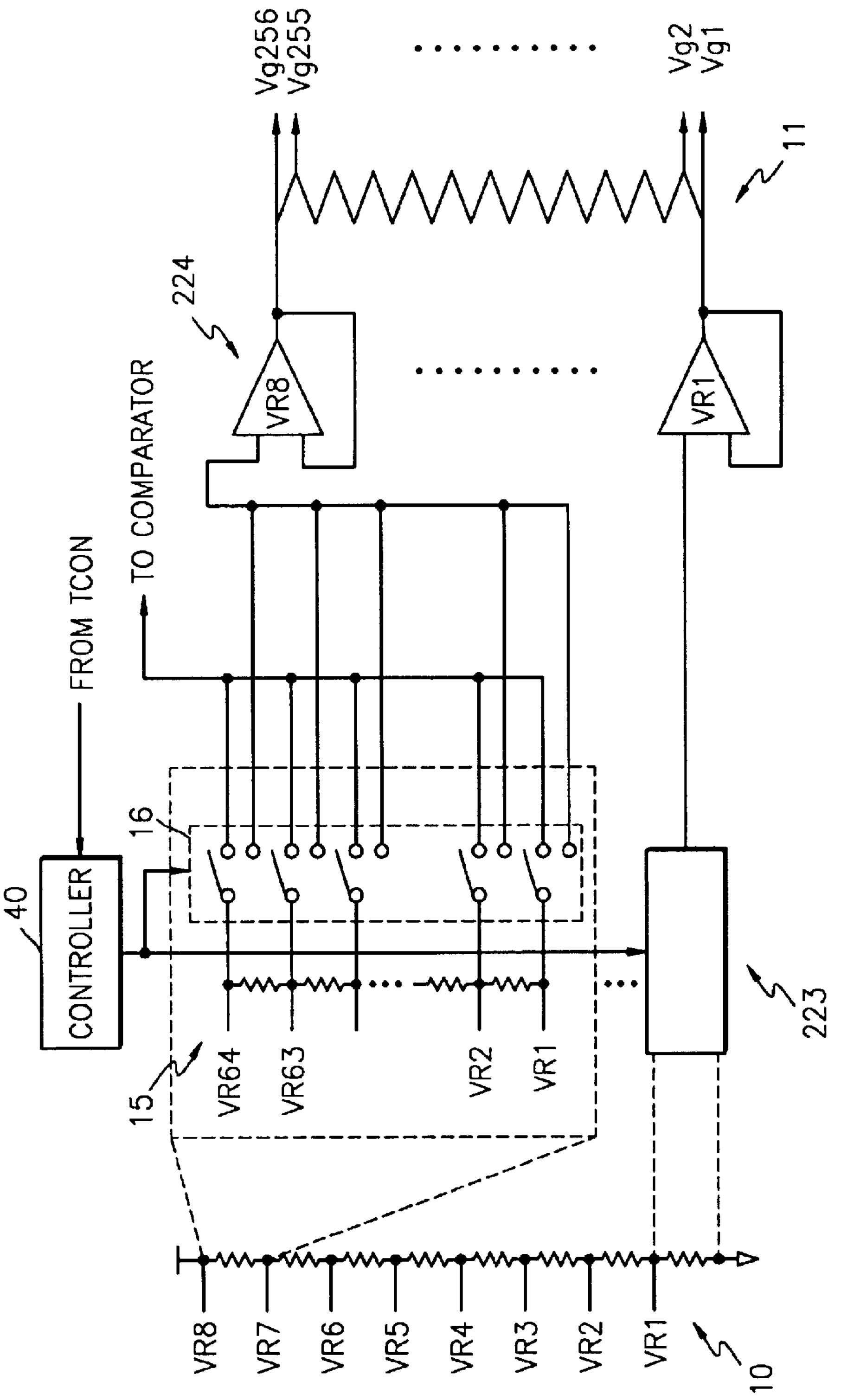

FIGS. 4*a* and 4*b* are block diagrams of an apparatus for supplying gamma signals, according to still another exemplary embodiment of the present invention. The gamma signal supplying apparatus may include a TCON 400, and a plurality of column drive units 410 and 420. A plurality of column drive units may be provided, but for convenience, only two column drive units: a first column drive unit 410 as a reference column drive unit and a second column drive unit 420 are illustrated.

The TCON 400 may include a gamma value generator 201 and a controller 402. The first column drive unit 410 may include a comparator 411 and a gamma set and drive unit 412. The second column drive unit 420 may include a comparator 421 and a gamma search and drive unit 422. The gamma set and drive unit 412 and the gamma search and drive unit 422 may each include a controller 40, a gamma search unit 223, a buffer unit 224, and a gray level resistor array 11, as shown in FIG. 4*b*.

The gamma search unit 223 may include a resistor array 15 and a switch unit 16.

The gamma value generator 201 is capable of storing multiple voltage levels in respective registers, just as in the gamma signal generator 10 of FIG. 1, and may output one of the stored values according to a control signal of the controller 402. The controller 402 may also output a reference digital code to the first column drive unit 410 and the second column drive unit 420.

The gamma set and drive unit 412 of the first column drive unit 410 may receive the reference digital code from the controller 402 of the TCON 400. The controller 40 of the gamma set and drive unit 412 may drive the switch unit 16 to read a gamma value according to the reference digital code from the resistor array 15, and may then output the read gamma value to the comparator 411. Then, the controller 40 may again drive the switch unit 16 to output the read gamma value to the buffer unit 224. The gray level resistor array 11 is capable of outputting a gray level value based on a value stored in the buffer unit 224.

The gamma search and drive unit 422 of the second column drive unit 420 may receive the reference digital code from the controller 402 of the TCON 400. The controller 40 of the gamma search and drive unit 422 may drive the switch unit 16, read a gamma value according to the reference digital code from the resistor array 15, and output the read gamma value to the comparator 411 of the first column drive unit 410 as well as to its own comparator 421. The comparator 411 of the first column drive unit 410 is capable of comparing the analog value output from the gamma set and drive unit 412 with the analog value output from the gamma search and drive unit 422. If both analog values are substantially identical, the controller 402 of the TCON 400 may send a signal indicating such to the gamma search and drive unit 422. The controller 40 of the gamma search and drive unit 422 may output the currently read gamma value from the switch unit 16 to the buffer unit 224, according to the signal.

If both values input to the comparator 411 are not substantially identical, the controller 402 of the TCON 400 may output a different reference digital code to the gamma search and drive unit 422. Accordingly, the gamma search and drive unit 422 repeatedly performs the above-described operations for gamma value searching.

The gray level resistor array 11 may output a gray level value based on the value stored in the buffer unit 224.

According to the present invention, serial transmission of a gamma signal gets may effectively reduce the number of signal lines. Consequently, it may be possible to apply the COG surface mount technique to the TFT panel fabrication.

Due to the serial transmission, when a gamma signal value is transmitted through signal lines from a timing controller to respective column drive units, undesirable changes in the gamma signal values can also be reduced. These changes are often a direct result of transmission interference caused in conventional gamma signal circuits. According to the exemplary embodiment illustrated in FIG. 4*a* and, effects by external conditions may also reduced, since an analog signal generated from a column drive unit is transferred only to an adjacent column drive unit.

Exemplary embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A gamma signal supplying apparatus, comprising:

a timing controller for storing predetermined gamma values as digital values, and for transmitting one of the digital values serially;

a gamma digital-to-analog controller (DAC) for receiving the serial digital gamma value, and for converting the serial digital gamma value into a first analog gamma value; and a plurality of column drive units, each of the plurality of column drive units for generating a second analog gamma value, for comparing the second analog gamma value to the first analog gamma value, and for outputting a gray level value based on the second analog gamma value if both values are substantially identical.

2. The apparatus of claim 1, wherein the column drive unit includes a resistor array having a plurality of resistors, the column drive unit for sequentially reading voltage values on the respective resistors and for outputting a read voltage value as the second analog gamma value if the read voltage value is substantially identical to the first analog gamma value.

3. The apparatus of claim 2, wherein the plurality of resistors in the resistor subdivide each gamma value stored in the timing controller into the smaller gamma values.

4. The apparatus of claim 2, wherein the column drive unit further comprises:

a resistor array having a plurality of resistors;

a comparator for comparing the first analog gamma value with the second analog gamma value;

a buffer unit for buffering the second analog gamma value;

a switch unit including a plurality of switches, each of the plurality of switches having a first port connected to respective resistors of the resistor array, a second port connected to the comparator, and a third port connected to the buffer unit, wherein the first port is connected to the second or third port according to a predetermined control signal;

a control unit for probing each resistor of the resistor array sequentially and outputting the predetermined control signal in order for the buffer unit to buffer the second analog gamma value according to a comparison result of the comparator; and a gray level resistor array for outputting a gray level value based on the value stored in the buffer unit.

5. The apparatus of claim 4, wherein the plurality of resistors in the resistor array subdivide each gamma value stored in the timing controller into the smaller gamma values within each corresponding predetermined range.

6. The apparatus of claim 1, wherein the column drive unit further comprises:

a resistor array having a plurality of resistors;

a comparator for comparing the first analog gamma value with the second analog gamma value;

a buffer unit for buffering the second analog gamma value;

a switch unit including a plurality of switches, each of the plurality of switches having a first port connected to respective resistors of the resistor array, a second port connected to the comparator, and a third port connected to the buffer unit, wherein the first port is connected to the second or third port according to a predetermined control signal;

a control unit for probing each resistor array sequentially and for outputting the predetermined control signal in order for the buffer unit to buffer the second analog gamma value according to a comparison result of the comparator; and a gray level resistor array for outputting a gray level value based on the value stored in the buffer unit.

7. A gamma signal supplying apparatus, comprising:

a timing controller for storing a predetermined gamma values as digital values, for transmitting one of the digital gamma values serially, and for outputting a reference digital code;

a gamma digital-to-analog converter (DAC) for receiving the serial digital gamma value, for converting the digital gamma value into a first analog gamma value, for comparing the first analog gamma value to a second analog gamma value input from a following unit, and for outputting the comparison result to the timing controller; and a plurality of column drive units, each the plurality of column drive units for receiving the reference digital code, for generating a second analog gamma value corresponding to the reference digital code to output the same to the gamma DAC, for receiving a predetermined indication signal from the timing controller, and for outputting a gray level value based on the second analog gamma value, wherein the timing controller receives the comparison result, and outputs the indication signal to the corresponding column drive unit if the first and second analog the gamma values are substantially identical.

8. The apparatus of claim 7, wherein the timing controller outputs another reference digital code to the corresponding column drive unit if the first and second analog gamma values are not substantially identical, this being repeated until the first and second analog gamma values are substantially identical.

9. The apparatus of claim 8, wherein the column drive unit includes a resistor array having a plurality of resistors, the column drive unit for reading a voltage value of a resistor at a location corresponding to the reference digital code, and for generating the second analog gamma value.

10. The apparatus of claim 9, wherein the plurality of resistors in the resistor array subdivide each gamma value stored in the timing controller into the smaller gamma values.

11. The apparatus of claim 8, wherein the column drive unit further comprises:

a resistor array having a plurality of resistors;

a comparator for comparing the first analog gamma value with the second analog gamma value;

a buffer unit for buffering the second analog gamma value;

a switch unit including a plurality of switches, each of the plurality of switches having a first port connected to respective resistors of the resistor array, a second port connected to the comparator, and a third port connected to the buffer unit, wherein the first port is connected to the second or third port according to a predetermined control signal;

a control unit for probing each resistor of the resistor array sequentially and for outputting the predetermined control signal in order for the buffer unit to buffer the second analog gamma value according to a comparison result of the comparator; and a gray level resistor array for outputting a gray level value based on the value stored in the buffer unit.

12. The apparatus of claim 11, wherein the plurality of resistors in the resistor array subdivide the gamma value stored in the timing controller into the smaller gamma values within each corresponding predetermined range.

13. The apparatus of claim 7, wherein the column drive unit includes a resistor array having a plurality of resistors, the column drive unit for reading a voltage value of a resistor at a location corresponding to the reference digital code, and for generating the second analog gamma value.

14. The apparatus of claim 7, wherein the column drive unit further comprises:

a resistor array having a plurality of resistors;

a comparator for comparing the first analog gamma value with the second analog gamma value;

a buffer unit for buffering the second analog gamma value;

a switch unit including a plurality of switches, each of the plurality of switches having a first port connected to respective resistors of the resistor array, a second port connected to the comparator, and a third port connected to the buffer unit, wherein the first port is connected to the second or third port according to a predetermined control signal;

a control unit for probing each resistor of the resistor array sequentially and for outputting the predetermined control signal in order for the buffer unit to buffer the second analog gamma value according to a comparison result of the comparator; and a gray level resistor array for outputting a gray level value based on the value stored in the buffer unit.

15. The apparatus of claim 7, wherein the gamma DAC further comprises:

a register unit for receiving the serial digital gamma value and for converting the digital gamma value into a parallel digital gamma value;

a DAC for converting the parallel digital gamma value into the first analog gamma value; and a comparator for comparing the first analog gamma value to the second analog gamma value input from the following unit, and for outputting a comparison result to the timing controller.

16. A gamma signal supplying apparatus, comprising:

a timing controller for storing predetermined gamma values as digital values, for transmitting one among the stored digital values serially, and for outputting a first reference digital code and a second reference digital code;

a first column drive unit for generating a first analog gamma value corresponding to the first reference digital code, for outputting a gray level value based on the analog gamma value, the first column drive unit including a first comparator for comparing the first analog gamma value with a second analog gamma value input from a following unit, and for outputting the compared result to the timing controller; and a plurality of second column drive units, each of the second column drive units serially connected and positioned behind the first column drive unit, for generating a second analog gamma value corresponding to the second reference digital code to output the same to a previous column drive unit, for outputting a gray level value based on the second analog gamma value if a predetermined indication signal is received from the timing controller, the second column drive unit includes a second comparator for comparing the second analog gamma value with a third analog gamma value inputted from a following unit, and for outputting the compared result to the timing controller;

wherein the timing controller outputs the indication signal to one of two column drive units and comparison targets if values compared by the first or second comparator are substantially identical.

17. The apparatus of claim 16, wherein if the second and third analog gamma values are not substantially identical, the timing controller outputs another second reference digital code to a corresponding second column drive unit until both gamma values are substantially identical.

18. The apparatus of claim 16, wherein the first column drive unit includes a resistor array having a plurality of resistors, the first column drive unit for reading a voltage value of a resistor at a location corresponding to the first reference digital code and for generating the first analog gamma value.

19. The apparatus of claim 18, wherein the plurality of resistors in the resistor array subdivide the gamma values stored in the timing controller into the smaller gamma values.

20. The apparatus of claim 16, wherein the first column drive unit further comprises:

a resistor array having a plurality of resistors;

the first comparator for comparing the first analog gamma value with the second analog gamma value, and for outputting a comparison result to the timing controller;

a buffer unit for buffering the first analog gamma value;

a switch unit including a plurality of switches, each of the plurality of switches having a first port connected to respective resistors of the resistor array, a second port connected to the comparator, and a third port connected to the buffer unit, wherein the first port is connected to the second or third port according to a predetermined control signal;

a control unit for probing each resistor of the resistor array sequentially and for outputting the predetermined control signal in order for the buffer unit to buffer the second analog gamma value according to a comparison result of the comparator; and a gray level resistor array for outputting a gray level value based on the value stored in the buffer unit.

21. The apparatus of claim 16, wherein the second column drive unit includes a resistor array having a plurality of resistors, the second column drive unit for reading a voltage value of a resistor at a location corresponding to the second reference digital code and for generating the second analog gamma value.

22. The apparatus of claim 21, wherein the plurality of resistors in the resistor array subdivide the gamma value stored in the timing controller into the smaller gamma values.

23. The apparatus of claim 16, wherein the second column drive unit further comprises:

a resistor array having a plurality of resistors;

the second comparator for comparing the second analog gamma value with the third analog gamma value, and for outputting the comparison result to the timing controller;

a buffer unit for buffering the second analog gamma value;

a switch unit including a plurality of switches, each of the plurality of switches having a first port connected to respective resistors of the resistor array, a second port connected to the comparator, and a third port connected to the buffer unit, wherein the first port is connected to the second or third port according to a predetermined control signal;

a control unit for probing each resistor of the resistor array sequentially and for outputting the predetermined control signal in order for the buffer unit to buffer the second analog gamma value according to a comparison result of the comparator; and a gray level for outputting a gray level value based on the value stored in the buffer unit.

* * * * *